United States Patent
Lin et al.

(10) Patent No.: US 6,882,458 B2
(45) Date of Patent: Apr. 19, 2005

(54) STRUCTURE OF AN OPTICAL INTERFERENCE DISPLAY CELL

(75) Inventors: Wen-Jian Lin, Hsinchu (TW); Hsiung-Kuang Tsai, Taipei (TW)

(73) Assignee: Prime View International Co., Ltd. (TW)

(*) Notice: Subject to any disclaimer, the term of this patent is extended or adjusted under 35 U.S.C. 154(b) by 0 days.

(21) Appl. No.: 10/742,062

(22) Filed: Dec. 20, 2003

(65) Prior Publication Data

US 2004/0207898 A1 Oct. 21, 2004

(30) Foreign Application Priority Data

Apr. 21, 2003 (TW) .................................... 92109262 A

(51) Int. Cl.⁷ ............................................... G02F 1/03
(52) U.S. Cl. .................................................. 359/247
(58) Field of Search ............................... 359/247, 260, 359/290, 223, 224, 291, 483, 498, 577

(56) References Cited

U.S. PATENT DOCUMENTS

| | | | |
|---|---|---|---|
| 5,654,819 A | * | 8/1997 | Goossen et al. ............ 359/291 |
| 5,835,255 A | | 11/1998 | Miles |
| 6,666,561 B1 | * | 12/2003 | Blakley ....................... 359/877 |
| 6,674,562 B1 | * | 1/2004 | Miles ........................... 359/291 |

* cited by examiner

Primary Examiner—Hung Xuan Dang
Assistant Examiner—Tuyen Tra
(74) Attorney, Agent, or Firm—Silicon Valley Patent Agency

(57) ABSTRACT

A structure of an interference display cell is provided. The cell comprises a first plate and a second plate, wherein a support is located between the first plate and the second plate. The second plate is a deformable and reflective plate. An incident light from one side of the first plate is modulated and only specific frequency light reflects by the second plate. The frequency of the reflected light is related to the distance between the first plate and the second plate. The support has at least one arm. The arm's stress makes the arm hiking upward or downward. The distance between the first plate and the second plate is also changed. Therefore, the frequency of the reflected light is altered.

29 Claims, 3 Drawing Sheets

STRUCTURE OF AN OPTICAL INTERFERENCE DISPLAY CELL

FIELD OF THE INVENTION

The present invention relates to a structure of an optical interference display. More particularly, the present invention relates to a structure of an optical interference display with posts of arms.

BACKGROUND OF THE INVENTION

Planar displays are popular for portable displays and displays with space limits because they are light and small in size. To date, planar displays in addition to liquid crystal displays (LCD), organic electro-luminescent displays (OLED), plasma display panels (PDP) and so on, as well as a mode of the optical interference display are of interest.

U.S. Pat. No. 5,835,255 discloses an array of display units of visible light that can be used in a planar display. Please refer to FIG. 1, which depicts a cross-sectional view of a display unit in the prior art. Every optical interference display unit 100 comprises two walls, 102 and 104. Posts 106 support these two walls 102 and 104, and a cavity 108 is subsequently formed. The distance between these two walls 102 and 104, that is, the length of the cavity 108, is D. One of the walls 102 and 104 is a hemi-transmissible/hemi-reflective layer with an absorption rate that partially absorbs visible light, and the other is a light reflective layer that is deformable when voltage is applied. When the incident light passes through the wall 102 or 104 and arrives in the cavity 108, in all visible light spectra, only the visible light with the wavelength corresponding to the formula 1.1 can generate a constructive interference and can be emitted, that is, $$2D = N\lambda \quad (1.1)$$

where N is a natural number.

When the length D of cavity 108 is equal to half of the wavelength times any natural number, a constructive interference is generated and a sharp light wave is emitted. In the meantime, if the observer follows the direction of the incident light, a reflected light with wavelength $\lambda_1$ can be observed. Therefore, the display unit 100 is "open".

The first wall 102 is a hemi-transmissible/hemi-reflective electrode that comprises a substrate, an absorption layer, and a dielectric layer. Incident light passing through the first wall 102 is partially absorbed by the absorption layer. The substrate is made from conductive and transparent materials, such as ITO glass or IZO glass. The absorption layer is made from metal, such as aluminum, chromium or silver and so on. The dielectric layer is made from silicon oxide, silicon nitrite or metal oxide. Metal oxide can be obtained by directly oxidizing a portion of the absorption layer. The second wall 104 is a deformable reflective electrode. It shifts up and down by applying a voltage. The second wall 104 is typically made from dielectric materials/conductive transparent materials, or metal/conductive transparent materials.

FIG. 2 depicts a cross-sectional view of a display unit in the prior art after applying a voltage. As illuminated in FIG. 2, while driven by the voltage, the wall 104 is deformed and falls down towards the wall 102 due to the attraction of static electricity. At this time, the distance between wall 102 and 104, that is, the length of the cavity 108 is not exactly zero, but is d, which can be zero. If we use d instead of D in formula 1.1, only the visible light with a wavelength satisfying formula 1.1, which is $\lambda_2$, can generate a constructive interference, and be reflected by the wall 104, and pass through the wall 102. Because wall 102 has a high light absorption rate for light with wavelength $\lambda_2$, all the incident light in the visible light spectrum is filtered out and an observer who follows the direction of the incident light cannot observe any reflected light in the visible light spectrum. The display unit 100 is now "closed".

An array comprising the display unit 100 controlled by voltage operation is sufficient for a single color planar display, but not for a color planar display. A method known to the art is to manufacture a pixel which comprises three display units with different lengths of the cavities. FIG. 3 and FIG. 4 are cross-section views for the color planar displays comprising display unit known to the arts. FIG. 3 illuminates a cross-section view for a prior art multi-layered color planar display. Multi-layered color planar display 200 comprises three layers, display units 202, 204 and 206. An incident light 208 is reflected by display units 202, 204 and 206. The wavelengths of the reflected light are different, for example, they can be red light, green light and blue light. The reasons to have reflected light with three different wavelengths is that the length of the cavities of display units 202, 204 and 206 are different, and also different reflective mirrors are used. One of the disadvantages of a multi-layered color planar display is its poor resolution. Also, as illuminated in FIG. 3, the blue light is less bright than the red light.

FIG. 4 illuminates a cross-section view for a prior at matrix color planar display. Three display units, display units 302, 304 and 306 are formed on a substrate 300. An incident light 308 is reflected by display units 302, 304 and 306. The wavelengths of the reflected light are different, for example, they are red light, green light and blue light. The reason to have reflected light with three different wavelengths is that the lengths of the cavities of display units 302, 304 and 306 are different. It is not required to use different reflective mirrors. The resolution is good, and the brightness of every color light is similar. However, display units with three different lengths of cavities need to be manufactured separately, for example, the region for forming the display units 304 and 306 is shielded by photo-resist while the process for forming the display unit 302 is performed. The manufacturing process is complicated and the yield is low. Moreover, the errors introduced during the manufacturing process, for instance, the errors of the lengths of cavities may cause red shift or blue shift. The mistake is uncorrectable and the substrate is wasted.

Therefore, it is important to develop a color optical interference display plate which has high resolution and brightness and is easy to manufacture.

SUMMARY OF THE INVENTION

It is therefore an objective of the present invention to provide an optical interference display unit structure used to form a color optical interference display. The resolution and brightness of the color optical interference display is high.

One objective of this invention is to provide an optical interference display unit structure applied in the production color optical interference display plate. The manufacturing process is simple and the yield of the manufacture is high.

It is another an objective of the present invention to provide an optical interference display unit structure applied in the production color optical interference display plate. The posts of the optical interference display unit structure have at least one arm.

In accordance with the foregoing objectives of the present invention, one preferred embodiment of the invention provides an optical interference display unit structure. The optical interference display unit structure has a first electrode and a second electrode. Posts are located between the two electrodes and support the electrodes to form a cavity. The length of the cavity is D. The post is consisted by a support and at least an arm. The first plate is a semi-transparent electrode, and the second plate is a deformable reflective electrode.

In accordance with the foregoing objectives of the present invention, one preferred embodiment of the invention provides an optical interference display unit structure. The optical interference display unit structure has a first electrode and a second electrode. Posts are located between the two electrodes and support the electrodes to form a cavity. The post has at least an arm and the shape of the post is T-shape or ⌈-shape. After a thermal process, such as a backing, the arm may generate displacement by stress action. The arm may generate displacement as the pivot of the support caused by stress action. An end of the arm adjacent to the support has less displacement, but another end of the arm has more displacement. The displacement of the arm may change the position of the second wall. The length of the cavity in the prior art is decided by the thickness of a sacrificial layer. In the present invention, the length of the cavity is decided by the displacement of the arm(s).

In the present invention, the arms with the ratios of various lengths to thicknesses have various amounts of stress, and displacements and directions generated by arms are various during baking. Therefore, the arms with the ratios of various lengths to thicknesses may be used for controlling the length of the cavity, instead of the various thicknesses of the sacrificial layers used in the various processes of the display units to control various wavelengths of light reflected in the prior art. There are many advantages in the above way. First of all, the cost drops drastically. The thickness of the cavity in the prior art is the thickness of the sacrificial layer, and the sacrificial layer needs to be removed at the end of the process. However, using an upward displacement of the arms in the present invention increases the length of the cavity, so that the length of the cavity is greater than the thickness of the sacrificial layer, even if the thickness of the sacrificial layer is substantially decreased while forming the same length of cavities. Therefore, the material used for manufacturing the sacrificial layer is substantially reduced. The second, the process time is shortened. The release etch process of the metal sacrificial layer in the prior art consumes lots of time, because the sacrificial layer is removed by an etching gas that must permeate the spaces between the posts. The present invention utilizes a mask for a front exposure, so the sacrificial layer can be transparent materials such as dielectric materials, instead of opaque materials such as metal and the like as in the prior art. Besides, the thickness used by the sacrificial layer can be substantially reduced, so the time required for the release etch process can be also drastically decreased. Third, the color optical interference display formed by using posts can substantially reduce complexity of the process. The difference in the ratios of lengths to thicknesses of arms of posts is used for changing the stress of the arms. After baking, various optical interference display units have various lengths of the cavities due to the displacement of arms, such that reflected light is changed with various wavelengths, such as red, green, and blue lights, so as to obtain various color lights.

In accordance with another an objective of the present invention, one preferred embodiment of the invention provides a matrix color planar display structure. Each matrix color planar display unit has three optical interference, display units. Every optical interference display unit comprises at least a first plate and a second plate. The two plates are set in parallel. The first plate is a semi-transparent electrode, and the second plate is a deformable reflective electrode. The two plates are supported by posts and a cavity is formed. Each arm of the T-shaped post of the optical interference display unit has variable length/ thickness ratio and stress. Therefore, after baking, each optical interference display unit has various cavity lengths due to the various displacements of arms, such that reflected light is changed with different wavelengths, such as red, green, and blue light. These in turn provide various color lights for a matrix color planar display structure.

In accordance with the color planar display consisting of an array of optical interference display units disclosed by the present invention, the advantages of a matrix color planar display according to the prior art are retained, including high resolution and high brightness, as well as the advantages of a multi-layered color planar display with a simple process and high yield in the prior art. It is understood that the present invention discloses an optical interference display unit which not only keeps all advantages of the prior optical interference color planar display such as high resolution, high brightness, simple process and high yield during forming arrays, but also increases the window during processing and raises the yield of the optical interference color planar display.

It is to be understood that both the foregoing general description and the following detailed description are examples, and are intended to provide further explanation of the invention as claimed.

BRIEF DESCRIPTION OF THE DRAWINGS

These and other features, aspects, and advantages of the present invention will be more fully understood by reading the following detailed description of the preferred embodiment, with reference made to the accompanying drawings as follows.

DETAILED DESCRIPTION OF THE PREFERRED EMBODIMENT

In order to provide more information of the optical interference display unit structure, the first embodiment is provided herein to explain the optical interference display unit structure in this invention. In addition, the second embodiment is provided to give further description of the optical interference color planar display formed with an array of the optical interference display unit.

Embodiment 1

Figure 1:
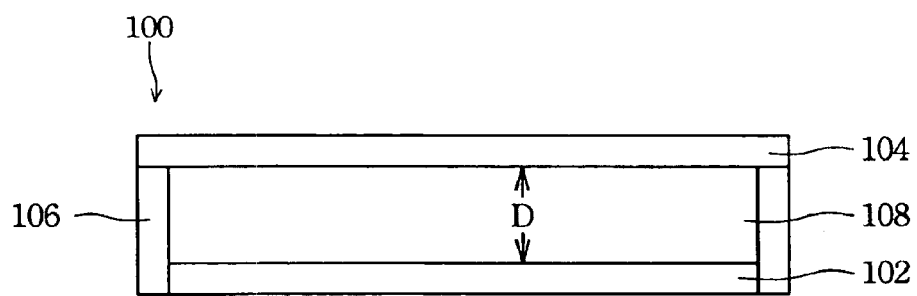
FIG. 1 depicts a cross-sectional view of a display unit in the prior art.
Figure 2:
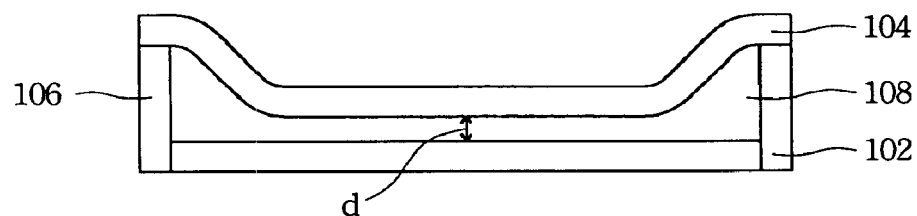
FIG. 2 depicts a cross-sectional view of a display unit in the prior art after applying a voltage.
Figure 3:
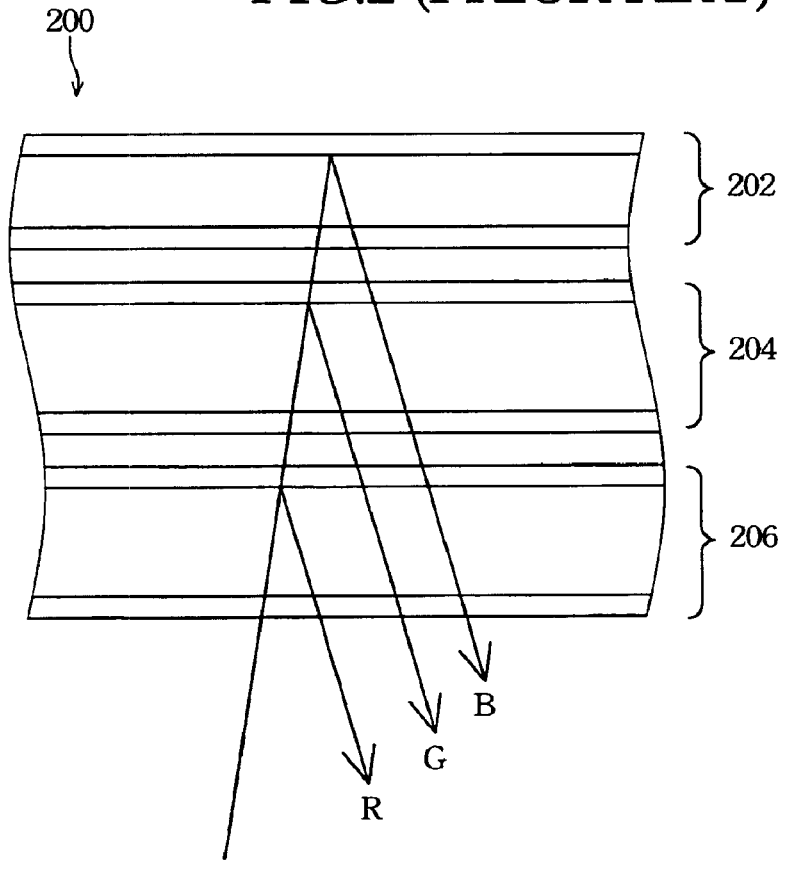
FIG. 3 depicts a cross-sectional view of a multi-layered color planar display in the prior art.
Figure 4:
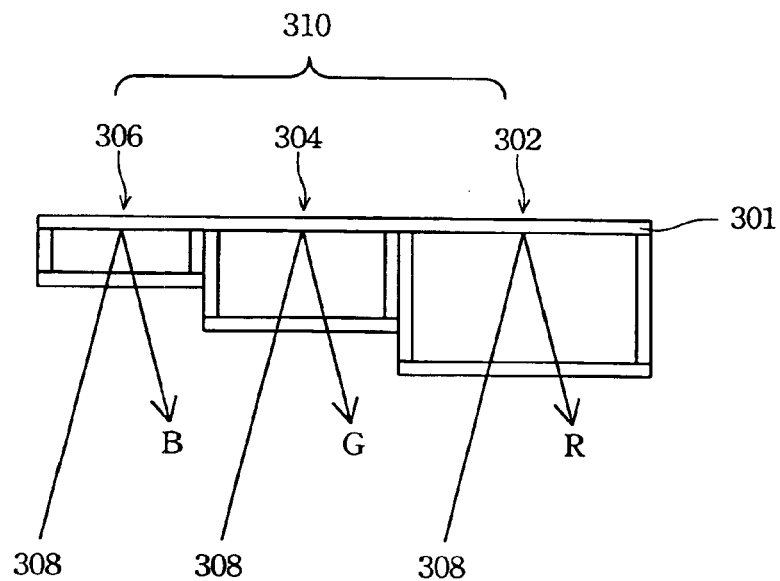
FIG. 4 depicts a cross-sectional view of a matrix color planar display in the prior art.
Figure 5:
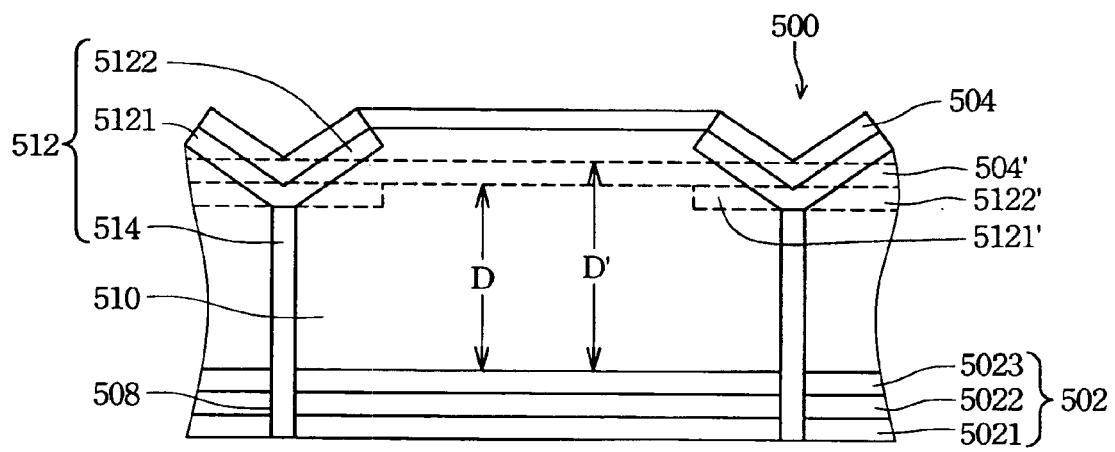
FIG. 5 depict an optical interference display unit structure according to the first preferred embodiment of this invention.

FIG. 5 depict an optical interference display unit structure according to the first preferred embodiment of this invention. Please refer to FIG. 5, an optical interference display unit 500 which functions as a color changeable pixel comprises at least a first plate 502 and a second plate 504. The two plates are set in parallel. The first plate 502 and the second plate 504 are selected from the group consisting of narrowband mirrors, broadband mirrors, non-metal mirrors, metal mirrors and the combination thereof.

The first plate 502 is a semi-transparent electrode which comprises a conductive substrate 5021, an absorption layer 5022, and a dielectric layer 5023. An incident light going through light incidence electrode 502 is partially absorbed by the absorption layer 5022. The conductive substrate 5021 is made from a conductive transparent material, such as ITO and IZO. The absorption layer 5022 is made from metal, such as aluminum or silver. The dielectric layer 5023 is made from silicon oxide, silicon nitride or metal oxide, which can be obtained by oxidation of part of the absorption layer 5022. The second plate 504 is a deformable reflective electrode. It shifts by the voltage applied. The second plate 504 is made from a dielectric material/conductive semi- or non-transparent material, or metal/conductive transparent material.

The two plates 502 and 504 are supported by a post 512. The post 512 has a support 514, which is located in an opening 508 and arms 5121, 5122. The length and thickness of the arms 5121 and 5122 depend on desired demand. Sequentially, a thermal process, such as baking, is performed. The arms 5121 and 5122 of the post 512 may generate displacement as the pivot of the support 514 caused by stress action, where ends of the arm 5121 and the arm 5122 adjacent to the support 514 have less displacement, but another ends of the arm 5121 and 5122 have more displacement. The displacement of the arm 5121 and 5122 may change the position of the second electrode 504.

The length of the cavity of the optical interference display unit in the prior art is decided by the thickness of a sacrificial layer. The length of the cavity is D if the thickness of the sacrificial layer is D. In this embodiment, a cavity 510 is formed between the first electrode 502 and the second electrode 504 supported by posts 512. The posts 512 have the arms 5121 and 5122. The ratio of lengths to thicknesses of the arms 5121 and 5122 decide stress thereof, and a dotted line 5121' and a dotted line 5122' label the positions prior to performing a thermal process of the arms 5121 and 5122. After performing the thermal process, the arms 5121 and 5122 may generate displacement; therefore the position of the second electrode 504 changes from the original position labeled by the dotted line 504', and the length D' of the cavity 510 between the first electrode 502 and the second electrode 504 changes from the original length D. Since the length of the cavity 510 is changed, the frequency of a reflected light changes following the length of the cavity 510. In general, when post 512 is made from polyamide compounds, the ratio of lengths to thicknesses of the arms 5121 and 5122 is between 5 and 50, and the length D' of the cavity 510 is approximately 1.5 to 3 times the length D of the thickness of the sacrificial layer. Of course, the ratio of lengths to thicknesses of the arms 5121 and 5122 can be changed to make the length D' of the baked cavity 510 smaller than the thickness of the sacrificial layer.

In this invention, the materials suitable for forming posts 512 include positive photoresists, negative photoresists, and all kinds of polymers such as acrylic resins and epoxy resins.

Embodiment 2

Figure 6:
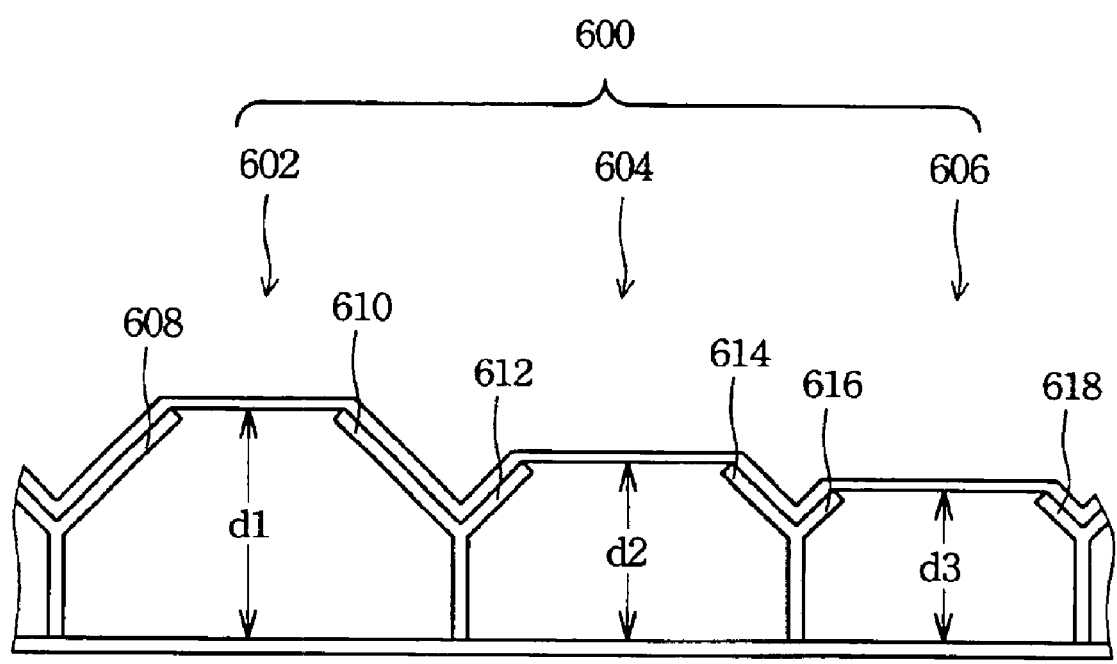
FIG. 6 depict an optical interference display unit according to the second preferred embodiment of this invention.

Referring is made to FIG. 6, FIG. 6 shows a cross-section view of an array of the optical interference display unit provided in the second embodiment of this invention. An array of modulation 600 comprises three optical interference display units: optical interference display unit 602, optical interference display unit 604 and optical interference display unit 606. Every optical interference display unit is a color changeable pixel. The structure of optical interference display unit is the same as the one provided in embodiment 1. The difference of the three optical interference display units is the arms of the posts of the optical interference display unit. The optical interference display unit 602 is supported by arms 608 and 610, the optical interference display unit 604 is supported by arms 612 and 614, and the optical interference display unit 606 is supported by arms 616 and 618. The length and the thickness of the arms 608 and 610, arms 612 and 614, and arms 616 and 618 are the same, therefore, the stress of every pair of arms is the same, too. After a thermal process, such as baking, is performed. The arms 608, 610, 612, 614, 616, and 618 of the optical interference display units 602, 604, and 606 may generate displacement caused by stress action. The displacements of the arms 608 and 610 are the same, the displacements of the arms 612 and 614 are the same, and the displacements of the arms 616 and 618 are the same. But there are various displacements among three above pairs of the arms. Therefore, the cavity 6102 of the optical interference display unit 602, the cavity 6104 of the optical interference display unit 604 and the cavity 6106 of the optical interference display unit 606 have different length d1, d2 and d3. As shown in formula 1.1, the wavelength of the reflected light is altered due to the change of the length of cavity. Light with different color, such as red light, green light or blue light is obtained.

The lengths of the cavities, d1, d2 and d3, are not decided by the thickness of the sacrificial layer. Therefore, using complicated manufacturing process to form the sacrificial layers with different thickness to define the length of the cavity is not necessary.

In accordance with the color planar display consisting of an array of optical interference display units disclosed by the present invention, the advantages of a matrix color planar display according to the prior art are retained, including high resolution and high brightness, as well as the advantages of a multi-layered color planar display with a simple process and high yield in the prior art. It is understood that the present invention discloses an optical interference display unit which not only keeps all advantages of the prior optical interference color planar display such as high resolution, high brightness, simple process and high yield during forming arrays, but also increases the window during processing and raises the yield of the optical interference color planar display.

The color planar display with an array of optical interference display unit provided in this invention retains the advantages of a prior art matrix color planar display known to the art, high resolution and brightness, and as well has the advantages of a multi-layered color planar display known to the art, simple manufacturing process and high yield. Comparing to a matrix color planar display known to the art, the lengths of the cavities of all optical interference display units are not decided by the thickness of the sacrificial layer. Therefore, using complicated manufacturing process to form the sacrificial layers with different thickness to define the length of the cavity is not necessary. The manufacturing process is simple and yield is high. Compared to a multi-layered color planar display known to the art, all the optical interference display units are on the same plane, therefore an incident light does not need to go through multi-layered optical interference display units. The resolution and brightness are high. Besides, in a prior art multi-layered color planar display, in order to make an incident light to go through a first optical interference display unit and be reflected by a second optical interference display unit efficiently, the composition and thickness of the first plate and the second plate of three types of optical interference display units are different. The manufacturing process is actually more complicated than expected. Manufacturing optical interference display units provided in this invention is less difficult than the optical interference display unit known to the art.

Although the present invention has been described in considerable detail with reference certain preferred embodiments thereof, other embodiments are possible. Therefore, their spirit and scope of the appended claims should no be limited to the description of the preferred embodiments container herein. In view of the foregoing, it is intended that the present invention cover modifications and variations of this invention provided they fall within the scope of the following claims and their equivalents.

What is claimed is:

1. An optical interference display unit at least comprising:
   a first electrode, wherein the first electrode further comprising:
     a substrate;
     an absorption layer on the substrate; and
     a dielectric layer on the absorption layer;
   a second electrode, wherein the second electrode is settled in parallel with the first electrode; and
   a post, at least comprising:
     a support, the support mounted on the first electrode; and
     at least one arm located on the top end of the support and supporting the second electrode;
   wherein the post located between the first electrode and the second electrode is used to form a cavity, and a corresponding length of the cavity is defined by displacement generated by stress action resulted from the arm being treated by a thermal process.

2. The optical interference display unit of claim 1, wherein the stress of the arm adjusted by the ratios of various length to thickness of the arm.

3. The optical interference display unit of claim 2, wherein the ratios of various length to thickness of the arm are between about 5 and 50.

4. The optical interference display unit of claim 1, wherein the thermal process is baking.

5. The optical interference display unit of claim 1, wherein the substrate is a transparent conductive substrate.

6. The optical interference display unit of claim 1, wherein a material for forming the dielectric layer is silicon oxide, silicon nitride or metal oxide.

7. The optical interference display unit of claim 1, wherein the absorption layer is made from metal.

8. The optical interference display unit of claim 1, wherein the substrate is made form ITO glass or IZO glass.

9. The optical interference display unit of claim 1, wherein the first electrode and the second electrode are selected from the group consisting of narrowband mirror, broadband mirror, non-metal mirror, metal mirror and the combination thereof.

10. The optical interference display unit of claim 1, wherein the second electrode is a deformable electrode.

11. The optical interference display unit of claim 1, wherein the second electrode is an up-and-down bendable plate.

12. The optical interference display unit of claim 1, wherein the second electrode at least comprises a dense material or a hemi-transparent material.

13. The optical interference display unit of claim 12, wherein the hemi-transparent material is ITO glass or IZO glass.

14. The optical interference display unit of claim 1, wherein the material for forming the posts is a photoresist.

15. The optical interference display unit of claim 1, wherein the shape of the post is T-shape or ⌈-shape.

16. An optical interference display unit at least comprising:
   a first electrode, wherein the first electrode further comprising:
     an substrate;
     an absorption layer on the substrate; and
     a dielectric layer on the absorption layer;
   a second electrode, wherein the second electrode is settled in parallel with the first electrode; and
   a T-shaped post located between the first electrode and the second electrode to form a cavity and a corresponding length of the cavity is defined by displacement generated by stress action resulted from arms of the T-shaped post being treated by a thermal process.

17. The optical interference display unit of claim 16, wherein the stress of the arm adjusted by the ratios of various length to thickness of the arm.

18. The optical interference display unit of claim 17, wherein the ratios of various length to thickness of the arm are between about 5 and 50.

19. The optical interference display unit of claim 16, wherein the thermal process is baking.

20. The optical interference display unit of claim 16, wherein the substrate is a transparent conductive substrate.

21. The optical interference display unit of claim 16, wherein a material for forming the dielectric layer is silicon oxide, silicon nitride or metal oxide.

22. The optical interference display unit of claim 16, wherein the absorption layer is made from metal.

23. The optical interference display unit of claim 16, wherein the substrate is made form ITO glass or IZO glass.

24. The optical interference display unit of claim 16, wherein the first electrode and the second electrode are selected from the group consisting of narrowband mirror, broadband mirror, non-metal mirror, metal mirror and the combination thereof.

25. The optical interference display unit of claim 16, wherein the second electrode is a deformable electrode.

26. The optical interference display unit of claim 16, wherein the second electrode is an up-and-down bendable plate.

27. The optical interference display unit of claim 16, wherein the second electrode at least comprises a dense material or a hemi-transparent material.

28. The optical interference display unit of claim 27, wherein the hemi-transparent material is ITO glass or IZO glass.

29. The optical interference display unit of claim 16, wherein the material for forming the T-shaped posts is a photoresist.

* * * * *